(12) United States Patent
Kang (10) Patent No.: US 7,684,239 B2
(45) Date of Patent: *Mar. 23, 2010

(54) FLASH MEMORY DEVICE FOR OVER-SAMPLING READ AND INTERFACING METHOD THEREOF

(75) Inventor: Dong-Gu Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

This patent is subject to a terminal disclaimer.

(21) Appl. No.: 12/034,055

(22) Filed: Feb. 20, 2008

(65) Prior Publication Data

US 2008/0205152 A1 Aug. 28, 2008

(30) Foreign Application Priority Data

Feb. 27, 2007 (KR) ...................... 10-2007-0019798

(51) Int. Cl.
*G11C 16/04* (2006.01)
(52) U.S. Cl. ............................. 365/185.03; 365/185.18
(58) Field of Classification Search ............ 365/185.03, 365/185.18, 185.2, 185.25
See application file for complete search history.

(56) References Cited

U.S. PATENT DOCUMENTS

| 7,023,735 | B2 | 4/2006 | Ban et al. | |
|---|---|---|---|---|
| 2008/0209111 | A1* | 8/2008 | Kang | ........................ 711/103 |
| 2008/0285354 | A1* | 11/2008 | Park et al. | ............. 365/185.21 |

FOREIGN PATENT DOCUMENTS

| JP | 2001101879 | | 4/2001 |
|---|---|---|---|
| JP | 2003051193 | | 2/2003 |
| JP | 2004086991 | A | 3/2004 |
| KR | 1020000033906 | A | 6/2000 |
| KR | 1020060025172 | A | 3/2006 |

* cited by examiner

*Primary Examiner*—Vu A Le
(74) *Attorney, Agent, or Firm*—Volentine & Whitt, PLLC (57) ABSTRACT

A memory system having a flash memory device that performs an over-sampling read operation to read data from a memory cell in the flash device by using an over-sampling read voltage that falls within a threshold voltage distribution range. A memory controller supplies a read mode signal to the flash memory device to perform the over-sampling read operation.

20 Claims, 9 Drawing Sheets

|  | I/O0 | I/O1 | I/O2 | I/O3 | I/O4 | I/O5 | I/O6 | I/O7 |
|---|---|---|---|---|---|---|---|---|
| 1st Cycle | A0 | A1 | A2 | A3 | A4 | A5 | A6 | A7 |
| 2nd Cycle | A8 | A9 | A10 | A11 | Aos | L | L | L |
| 3rd Cycle | A12 | A13 | A14 | A15 | A16 | A17 | A18 | A19 |
| 4th Cycle | A20 | A21 | A22 | A23 | A24 | A25 | A26 | A27 |
| 5th Cycle | A28 | A29 | A30 | L | L | L | L | L |

A0~A11 : Column Address
A12~A19 : Page Address
A20~A30 : Block Address
Aos : Read mode

FLASH MEMORY DEVICE FOR OVER-SAMPLING READ AND INTERFACING METHOD THEREOF

CROSS-REFERENCE TO RELATED APPLICATIONS

This application claims the benefit of Korean Patent Application No. 10-2007-0019798, filed on Feb. 27, 2007 in the Korean Intellectual Property Office, the disclosure of which is incorporated herein in its entirety by reference.

BACKGROUND OF THE INVENTION

1. Field of the Invention

Embodiments of the invention relate to semiconductor memory devices. More particularly, embodiments of the invention relate to a flash memory device for an over-sampling read operation on a memory cell and an associated interfacing method.

2. Discussion of Related Art

Semiconductor memory devices are largely classified into volatile and non-volatile devices. Volatile semiconductor memory devices are characterized by fast reading and writing speeds, but the stored contents disappear when no external power is applied. In contrast, non-volatile semiconductor memory devices retain their stored contents even when no power is applied. Therefore, non-volatile semiconductor memory devices are used to store vital contents which must remain regardless of whether or not power is supplied to the device. Examples of non-volatile semiconductor memory devices include, for example, mask read-only memory (MROM), programmable read-only memory (PROM), erasable programmable read-only memory (EPROM), and electrically erasable programmable read-only memory (EEPROM).

Since erase and write operations are relatively complicated in MROM, PROM, and EPROM devices, memory contents may not be able to be updated. Because erase and write operations can be electrically done in EEPROM devices, these devices are more commonly used in system programming or auxiliary memory device applications which require continuous updating. Flash EEPROM devices have a higher degree of system integration compared to a typical EEPROM device because of its high-capacity memory applications. A NAND-type flash EEPROM (hereinafter, referred to as a NAND flash memory) has a remarkably higher degree of systems integration compared to other flash EEPROM.

As demands for memory capacity increases, devices that store multi-bit data in one memory cell are actively under development. When storing 1-bit data in a memory cell, the memory cell has two threshold voltage distributions; one voltage threshold corresponds to a data 1 and the other voltage threshold corresponds to a data 0. However, when storing 2-bit data in a single memory cell, the cell is programmed with one of four threshold voltage distributions. Additionally, when storing 3-bit data in a single memory cell, a memory cell is programmed with one of eight threshold voltage distributions. Recently, various technologies for storing 4-bit data on one memory cell are actively under development.

Figure 1A:
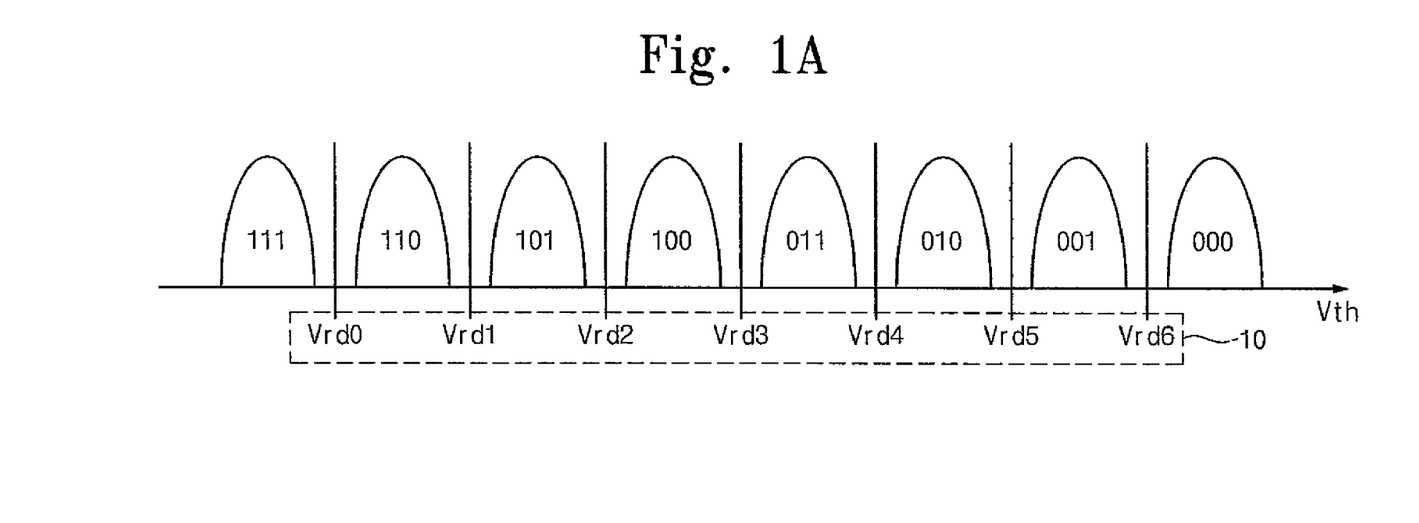
FIG. 1a is a diagram illustrating a normal read operation of a typical multi-bit memory cell.

FIG. 1a is a diagram illustrating a normal read operation of a typical multi-bit memory cell where read voltages 10 are used to read multi-bit data in a memory cell allocated between threshold voltage distributions corresponding to 3-bit data (i.e., '111', '110', '101', ..., '001', '000'), respectively. Read voltage Vrd3 is applied to a word line of a memory cell to read data of a most significant bit (MSB) page (e.g., a first page) of 3-bit data. A read voltage Vrd1 or Vrd5 is applied to read data of a second page between the MSB page and a least significant bit (LSB) page (e.g., a third page). Lastly, read voltages Vrd0, Vrd2, Vrd4, and Vrd6 are applied to a word line of memory cells to read data of the LSB page.

Accurate control of a program voltage Vpgm and a verify voltage Vvfy is essential to storing multi-bit data in one memory cell. Each interval between threshold voltage distributions in memory cells can be densely controlled by accurately controlling the voltage. In particular, a step size of a program voltage can be reduced for dense threshold voltage distributions. However, this drastically decreases program speed. Otherwise, threshold voltage distributions of memory cells can be formed in a broader voltage range. A high voltage pump is required to accommodate this broader voltage range which in turn, increases device costs. Attempts to resolve the above limitations are typically targeted at the read operation rather than the program operation. One attempt focuses on an over-sampling read operation or a fractional read operation through a maximum likelihood method. The over-sampling read operation utilizes a relative interval from a reference value of the threshold voltage distribution (e.g., a middle value of threshold voltage distribution).

Figure 1B:
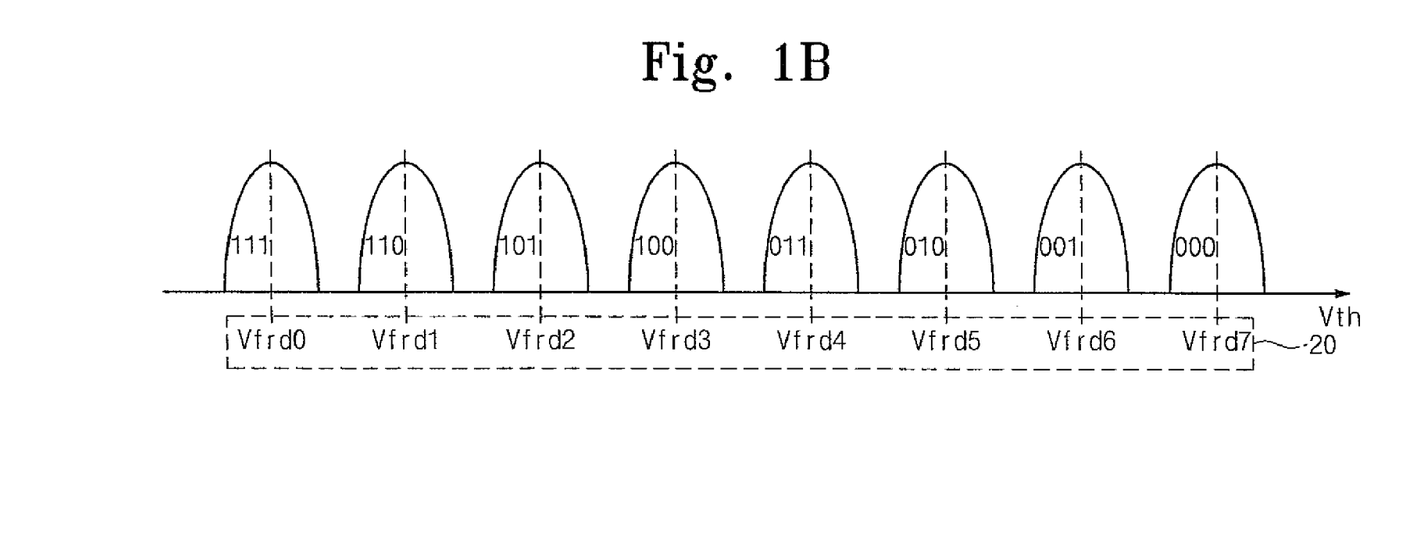
FIG. 1b is a diagram illustrating an over-sampling read operation of a typical multi-bit memory cell.

FIG. 1b is a diagram illustrating an over-sampling read operation of a multi-bit memory cell. Over-sampling read voltages Vfrd0 to Vfrd7 are set within each threshold voltage distribution not between threshold voltage distributions as illustrated in FIG. 1a. An over-sampling voltage is applied to perform an over-sampling read operation one time with respect to one threshold voltage distribution. Accordingly, the respective over-sampling read voltages Vfrd0 to Vfrd7 are set with middle values (or, average values) of corresponding threshold voltage distributions. However, when performing an over-sampling read operation two or three times with respect to one threshold voltage distribution, over-sampling read voltages are set with values that equally divide one threshold voltage distribution into a plurality of units.

By utilizing a normal read operation and an over-sampling read operation, the read operation can be performed using a relative interval from a reference value of a threshold voltage distribution (e.g., an average value of distribution). Over-sampling read or fractional read operations are disclosed in U.S. Pat. No. 7,023,735 entitled "METHODS OF INCREASING THE RELIABILITY OF A FLASH MEMORY" and Japanese Patent Publication No. 2001-101879 entitled "SEMICONDUCTOR MEMORY DEVICE", which are incorporated by reference. Accordingly, there is a need for a device or method for outputting over-sampling data.

SUMMARY OF THE INVENTION

Exemplary embodiments of the present invention are directed to a memory device having a flash memory. In an exemplary embodiment, the flash memory device includes a memory array defined by a plurality of memory cells. The memory device is configured to read data from one of the plurality of memory cells by performing an over-sampling read operation. The over sampling read operation utilizes an over sampling read voltage defined within a threshold voltage distribution range. The memory controller communicates with the flash memory device and is configured to supply a read mode signal to the flash memory device to perform the over-sampling read operation.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Below, a NAND flash memory device is used as one example for illustrating characteristics and functions of the present invention. However, the present invention may be embodied or applied through other embodiments. Furthermore, an over-sampling read operation reads data of memory cell by using a read voltage in a range of a threshold voltage distribution of a defined memory cell. That is, the over-sampling read operation is identical to a fractional read operation.

Figure 2:
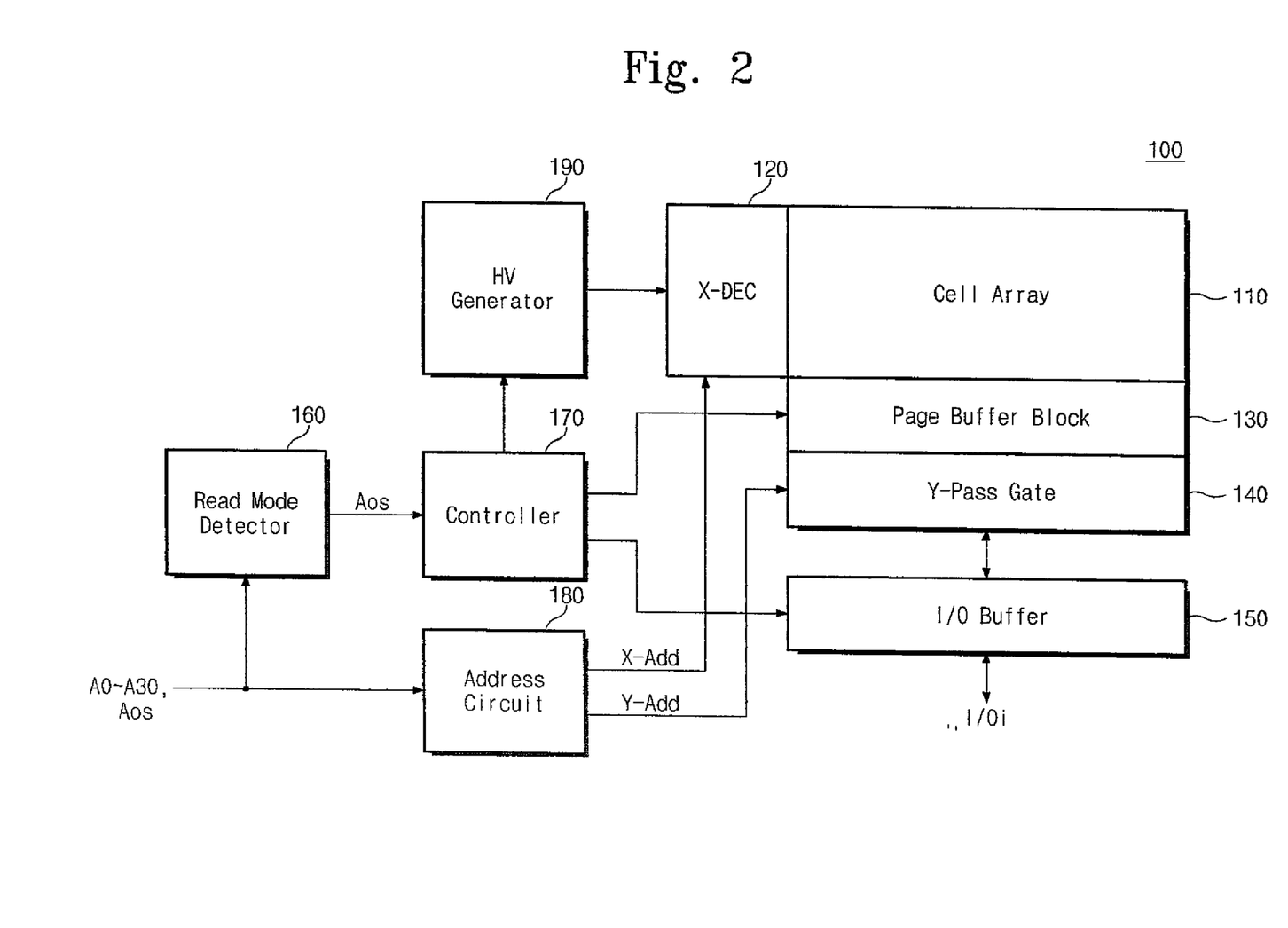
FIG. 2 is a block diagram according to a first embodiment of the present invention.

FIG. 2 is a block diagram of a memory device 100 which determines whether to perform an over-sampling read operation or a normal read operation at addresses A0 to A30. When the read operation is selected based on a memory cell address, the flash memory device generates a read voltage Vread corresponding to the selected read mode and detects data in a memory cell. Cell array 110 includes memory cells connected to a bit line and a word line. Typically, NAND flash memory cells include a string unit connected in series to one bit line. Multi-bit flash memory cells are programmed with one of a plurality of threshold voltage states to store a plurality of bits in one memory cell. Accordingly, it is difficult for the multi-bit flash memory device to provide a sufficient read margin between threshold voltage states by typical program methods and circuit technologies. Consequently, the multi-bit flash memory cells are densely programmed to include the number of threshold voltage states (2k) corresponding to the number of bits k stored within a limited threshold voltage range. Additionally, intervals (i.e., read margins) between threshold voltage states of the multi-bit flash memory cell are also decreased.

Row decoder 120 selects a word line in response to a row address X-add and delivers various word line voltages provided from high voltage generator 190 to the selected word lines. During a program operation, a program voltage Vpgm (about 15 to 20 V) is applied to a selected word line, and a pass voltage Vpass (about 10 V) is applied to an unselected word line. During a read operation, read voltages Vrd0 to Vrd6 or Vfrd0 to Vfrd7 provided from high voltage generator 190 are applied to a selected word line. Page buffer block 130 operates as a write driver or a detect amplifier depending on an operational mode. For example, page buffer block 130 operates as a detect amplifier during a read operation mode, and operates as a write driver during a program operation mode. During an over-sampling operation, page buffer block 130 detects data of the selected memory cells according to controller 170.

A Y-pass gate 140 selects columns by a predetermined unit (e.g., I/O unit), which are selected in response to a column address Y-Add. Y-pass gate 140 selects registers (not shown) of the page buffer block 130 in response to column address Y-Add. During a program operation, the selected registers store program data bits provided through input/output buffer 150. During a read operation, data bits of the selected registers are outputted via Y-pass gate 140.

Input/output buffer 150 temporarily stores addresses, commands, and input data inputted through input/output pin I/Oi. Input/output buffer 150 delivers the stored address, the program data, and the commands to the address buffer, the Y-pass gate 140, and a command register (not shown), respectively. Read mode detector 160 monitors the inputted address bits A0 to A30 and Aos and detects a read mode bit Aos indicating a read mode among inputted address bits during a plurality of clock cycles. The detected read mode bit Aos is provided to controller 170.

Controller 170 accesses a cell region corresponding to addresses A0 to A30 inputted in response to read mode signal Aos provided from read mode detector 160. In particular, when the read mode signal Aos represents a normal read mode, controller 170 controls a high voltage generator 190 to generate read voltages Vrd0 to Vrd6. Controller 170 controls page buffer block 130 and input/output buffer 150 to output page data detected according to the above read operation. On the other hand, when the read mode signal Aos represents an over-sampling read mode, controller 170 sequentially performs an over-sampling read operation after the normal read operation in order to perform a probability read operation. Controller 170 primarily performs a normal read operation by read voltages Vrd0 to Vrd6 of the selected memory cells. Once the normal read operation is completed, controller 170 controls high voltage generator 190 to generate the over-sampling read voltages Vfrd0 to Vrfd7 that divide the threshold voltage distributions associated with the memory cells. While the over-sampling read voltages Vfrd0 to Vrfd7 are provided to the selected word line, controller 170 controls page buffer block 130 to detect the bit line of the selected cells and latch the detected data.

Address circuit 180 stores addresses A0 to A30 inputted during a plurality of cycles and divides the stored addresses into a row address X-Add and a column address Y-add. Address circuit 180 may include a Y-decoder (not shown) configured to decode the inputted address bits to provide column address Y-Add to the Y-pass gate 140. High voltage generator 190 generates a read voltage that is provided into a word line of memory cells according to a read mode. In a typical read mode of multi-bit data, high voltage generator 190 generates the read voltages Vrd0 to Vrd6 of FIG. 1a and provides them to row decoder 120. However, during an over sampling read mode, high voltage generator 190 generates the read voltages Vfrd0 to Vfrd7 of FIG. 1b based on controller 170. The read voltage levels Vfrd0 to Vfrd7 generated by high voltage generator 190 are not limited to middle values of the threshold voltage distributions. That is, the number of over-samplings corresponding to one threshold voltage distribution may be set to more two or three times. Denser voltage differences are generated as the number of over-sampling read voltages increase. In this manner, flash memory device 100 detects a read mode signal Aos associated with address bits. When the detected read mode signal Aos indicates over-sampling, controller 170 controls high voltage generator 190 and page buffer block 130 to perform an over-sampling read operation. At this point, high voltage generator 190 generates over-sampling read voltages and supplies them to row decoder 120.

Figure 3:
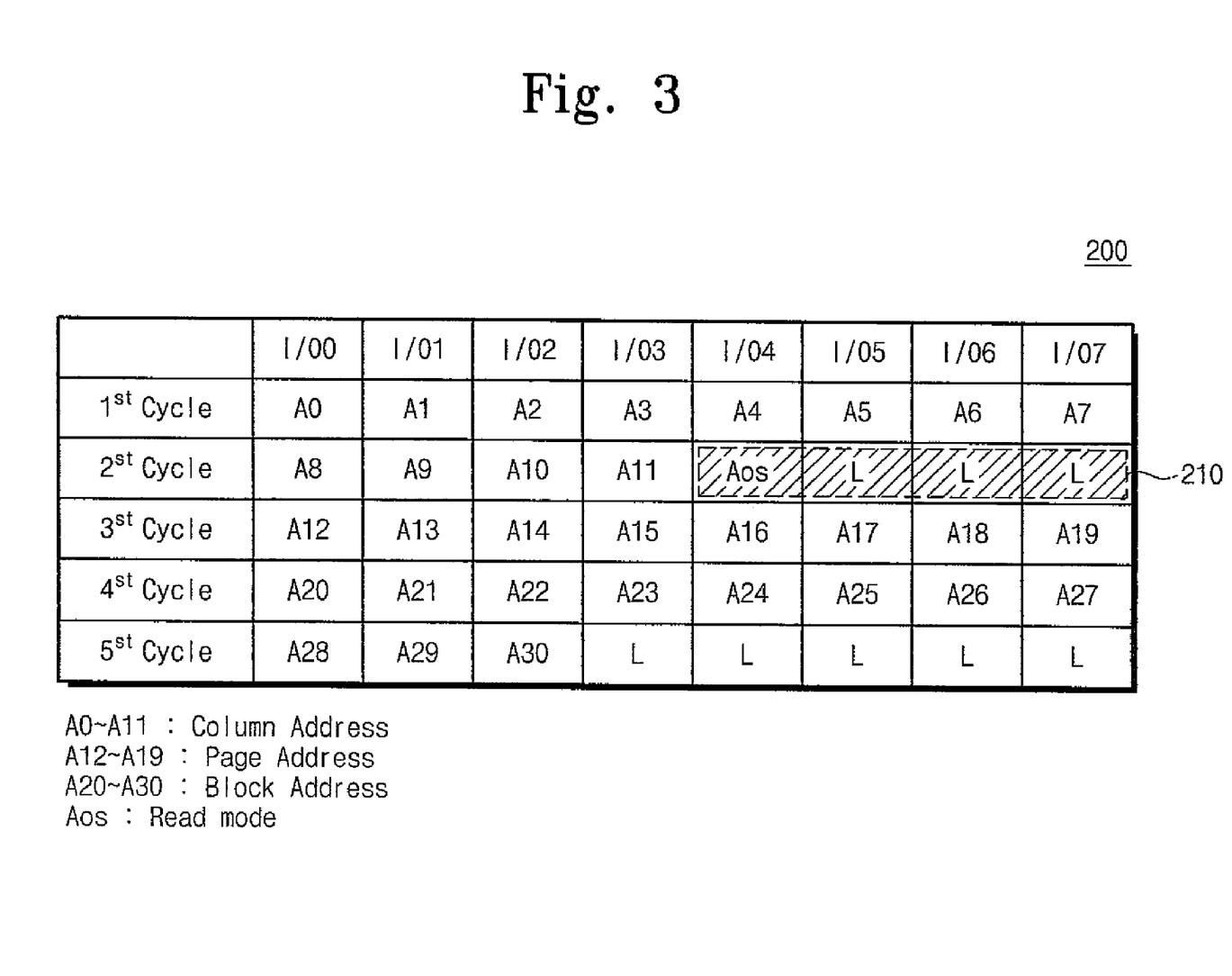
FIG. 3 is a table of an address allocation method of a flash memory device of FIG. 2.

FIG. 3 is an exemplary address table 200 of an address allocation method of the flash memory device 100 shown in FIG. 2. Command values for address bits of input/output pins (I/Oi, i=1 to 7) that correspond to 1st to 5th clock cycles of an input/output bus. Flash memory device 100 receives addresses, commands and data via input/output pins (e.g., I/00 to I/07). Typically, column addresses A0 to A11 are provided to flash memory device 100 during first and second cycles. During the remaining third to fifth cycles, row addresses A12 to A30 are provided to the flash memory device 100. The row address A12 to A30 includes a page address for selecting pages and a block address for selecting memory blocks. It is apparent to those skilled in the art that address bits are determined by a row, a column, and a block of the flash memory device.

Because 32 word lines and odd and even bit lines are provided for each memory block where 3-bit data are stored on each cell, one memory block includes 192 pages (=32WL× 2P×3B). A page address is an 8-bit address (e.g., A12 to A19) to select 192 pages. Address bit A12 is used as information to select one of odd and even bit lines. Address bits A13 and A14 are used as information to select one of three data bits (or, referred to as first to third page bits) stored in each cell. Address bits A15 to A19 are used as information for selecting one of the word lines (e.g., 32 word lines) associated with each memory block. However, it is apparent to those skilled in the art that the address bit positions are exemplary and not limited as disclosed herein.

The column address is inputted during the initial two cycles (i.e., first and second cycles) among address input intervals (five cycles). However, there are address bits 210 that are not used among address bits inputted during a second cycle. Typically, address bits 210 maintain a logic low level while the flash memory device 100 uses one bit among the meaningless surplus bits of address bits 210 to indicate the read mode. For example, input/output pin I/04 of the second address cycle is set as the value of read mode signal Aos to indicate whether or not an over-sampling read operation is performed. Alternatively, the address bit indicating the read mode can be one of the input/output pin I/04 to I/07 during a second address input cycle.

Figure 4:
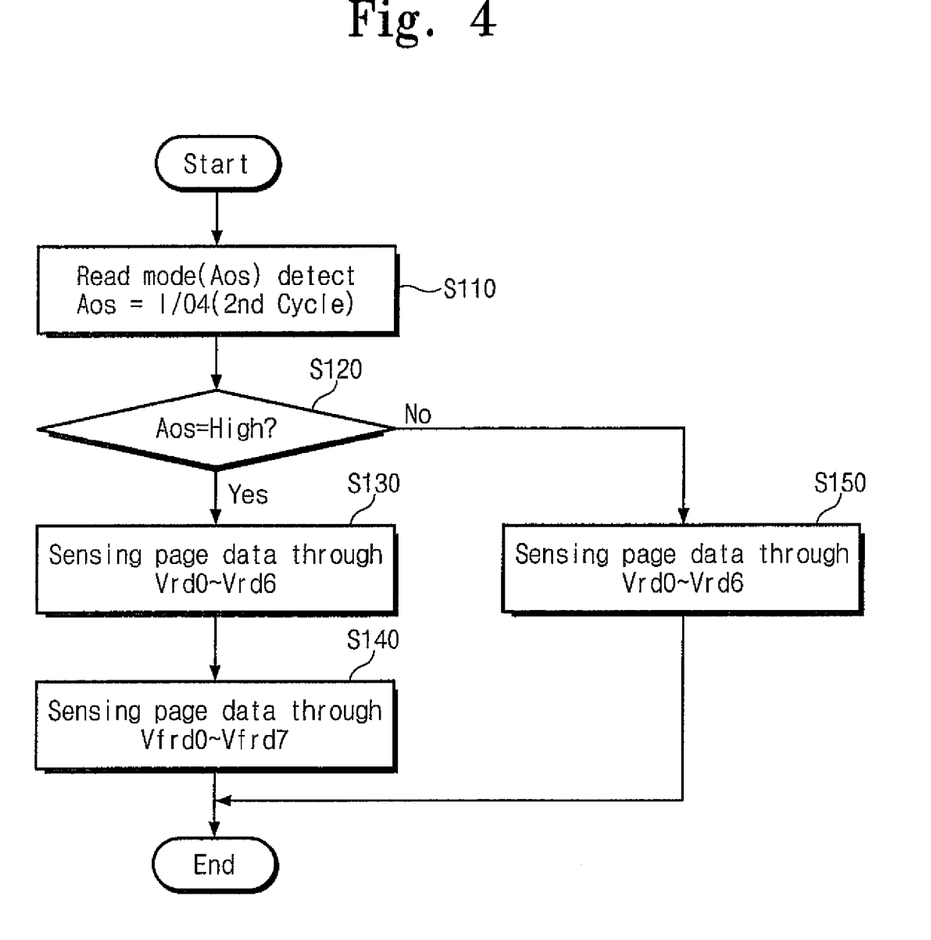
FIG. 4 is a flowchart of a read operation of a flash memory device of FIG. 2.

FIG. 4 is a flowchart illustrating a read operation of the flash memory device shown in FIG. 2. Once a command and an address are inputted externally to read data of a memory cell, controller 170 enters a control mode to read data from a memory cell. A bit value of the read mode signal Aos is detected from address bits that are sequentially inputted by read mode detector 160 and then outputted to controller 170. At step S110, controller 170 performs a compare operation to determine whether the read mode signal Aos level is associated with an over-sampling read operation or a normal read operation at step S120. If the read mode signal Aos is HIGH, an over-sampling read operation is performed to read the data where controller 170 controls page buffer block 130 and high voltage generator 190 performs an over-sampling read operation right after the normal read operation. At step s130, controller 170 reads multi-bit data of a memory cell by a page unit according to the read voltages Vrd0 to Vrd6. At step S140, a control operation for an over-sampling read operation is performed where controller 170 senses multi-bit data of a memory cell according to over-sampling read voltages Vrfd0 to Vrfd7 and outputs the sensed data. By performing an over-sampling read operation right after a normal read operation, the flash memory device outputs reliable data.

When the read mode signal Aos is LOW as determined at step 120, controller 170 performs a general control operation for a normal read operation. Controller 170 controls page buffer block 130, input/output buffer 150, and high voltage generator 190 to sense a bit line and output data while the read voltages Vrd0 to Vrd6 are provided to a word line of the selected memory cell. The normal read operation is completed when all data corresponding to the inputted address are outputted. Based on the mode performed, one of a surplus of a plurality of bits that are not used among the address bits is allocated as a value indicating a read mode. Flash memory device 100 detects the inputted read mode signal Aos to perform a normal read operation or an over-sampling read operation.

Figure 5:
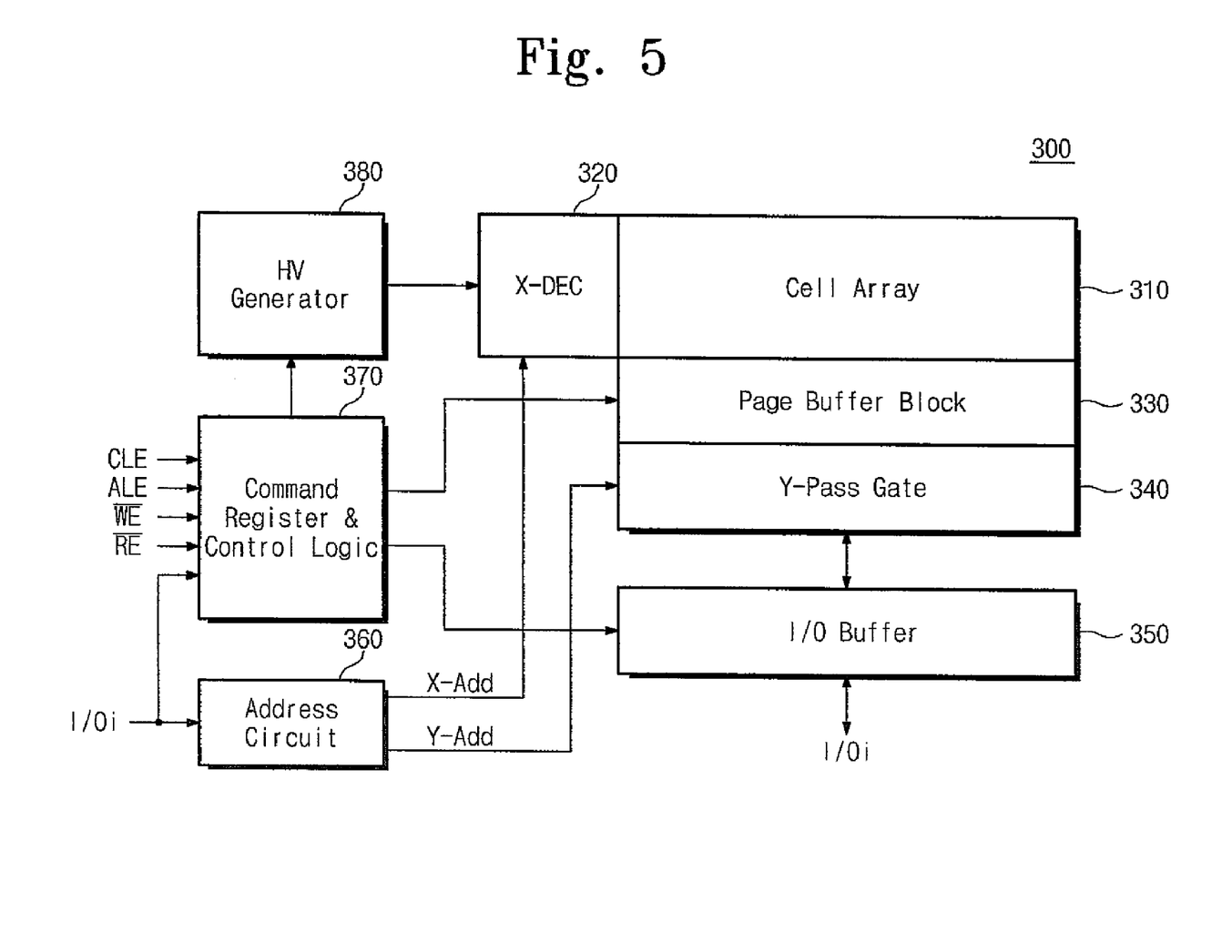
FIG. 5 is a block diagram according to a second embodiment of the present invention.

FIG. 5 is a block diagram illustrating a flash memory device 300. Memory device 300 senses and outputs data of a memory cell in response to a command code (e.g., 32h) indicating an over-sampling read operation, which is provided into an input/output pin I/Oi. Cell array 310 includes memory cells connected to a bit line and a word line. Typically, NAND flash memory cells are made by a string unit connected in series to one bit line. As referenced above, multi-bit flash memory cells are programmed with one of a plurality of threshold voltage states to store a plurality of bits in one cell. Row decoder 320 selects a word line in response to a row address and delivers various word line voltages provided from high voltage generator 380 to the selected word lines. During a program operation, the row decoder 320 delivers a program voltage Vpgm (about 15 to 20 V) and a pass voltage Vpass (about 10V) to a selected word line and an unselected word line, respectively. During a read operation, row decoder 320 sequentially delivers read voltages Vrd0 to Vrd6 to a word line. That is, read voltage Vrd3 is provided first and then other read voltages are sequentially provided to read an MSB page. During an over-sampling read operation, row decoder 320 provides over-sampling read voltages Vrfd0 to Vrfd7 to the select word line.

Page buffer block 330 includes a plurality of page buffers. Each page buffer is connected to a bit line of selected memory cells where program data is written or the written data is detected. In a normal read mode or an over-sampling read mode, each of the page buffers senses a bit line of each of the memory cells. Each of the page buffers detects whether the memory cells are on or off through a bit latch line. The latched detected data will be outputted via Y-pass gate 340. Y-pass gate 340 selects columns by a predetermined unit (e.g., I/O unit) selected in response to column address Y-Add. The Y-pass gate 340 selects latches (not shown) of page buffer block 330 in response to column address Y-Add. During a program operation, the selected latches store program data bits provided from the input/output buffer 350. During a read operation, the latches of the selected page buffer are outputted through Y-pass gate 340.

Input/output buffer 350 temporarily stores addresses, commands, and input data inputted through input/output bus I/Oi. Input/output buffer 350 delivers the addresses, the program data, and the commands, which are inputted into the input/output bus I/Oi, into address circuit 360, Y-pass gate 340, and command register and control logic 370, respectively. Address circuit 360 selectively receives address bits (e.g., A0 to A30) inputted through input/output buffer 350. Address circuit 360 divides and stores address bits A0 to A30 inputted during a plurality of cycles, into a row address X-Add and column address Y-Add. Address circuit 360 properly decodes the stored row address X-Add and column address Y-Add and supplies these addresses to row decoder 320 and Y-pass gate 340.

Command register and control logic 370 receives a command inputted through input/output buffer 350. Command register and control logic 370 receives control signals (e.g., CLE, ALE, /WE, and /RE) inputted via control pins of the memory device. Command register and control logic 370 performs a control operation for a normal read operation or an over-sampling read operation in response to commands (e.g., 00h, 80h, 30h, 32h, and 33h) inputted via the input/output pins and the above control signals. The normal read operation is performed by a known command sequence 00h-address-30h. However, the over-sampling read operation is performed by a command sequence 00h-address-32h. Here, the command code 32h must be allocated as a new command code for an over-sampling read operation. Command register and control logic 370 recognizes command code 32h as a command associated with the over-sampling read operation. Alternatively, 33h and 34h, which are not defined in a memory specification, can be used for a command code for the over-sampling read operation.

Command register and control logic 370 controls high voltage generator 380 to generate read voltages Vfrd0 to Vfrd7 in response to a command for the over-sampling operation. Command register and control logic 370 controls high voltage generator 380 to sequentially provide over-sampling read voltages Vfrd0 to Vfrd7 according to a sequence of a corresponding page unit in response to a command associated with the over-sampling read operation. Here, it is apparent to those skilled in the art that the over-sampling read operation is performed using the same method of a cache read mode 00h-Address-31 h. That is, command register and control logic 370 can be set to read only one page when the command code is 32h, and read all pages corresponding to multi-bit data in an over-sampling read mode when the command code is 33h.

High voltage generator 380 generates a read voltage that is provided to a word line of memory cells according to command register and control logic 370. In a typical read mode of multi-bit data, high voltage generator 380 generates read voltages Vrd0 to Vrd6 of FIG. 1a and provides them to row decoder 320. However, in an over-sampling read mode, high voltage generator generates over sampling read voltages Vfrd0 to Vfrd7 of FIG. 1b according to command register and control logic 370. The read voltage Vfrd0 to Vfrd7 levels generated in high voltage generator 380 are not limited to middle values of threshold voltage distributions. That is, the number of over-samplings corresponding to one threshold voltage distribution may be set more than two or three times where a higher number of over-sampling read voltages are generated with denser voltage differences.

In an alternative embodiment, flash memory device 300 performs an over-sampling read operation in response to command code 32h. When the command code is 30h, command register and control logic 370 performs a control operation for a normal read operation on multi-bit data. However, when the command code is 32h, command register and control logic 370 performs a control operation for an over-sampling read operation.

Figure 6A:
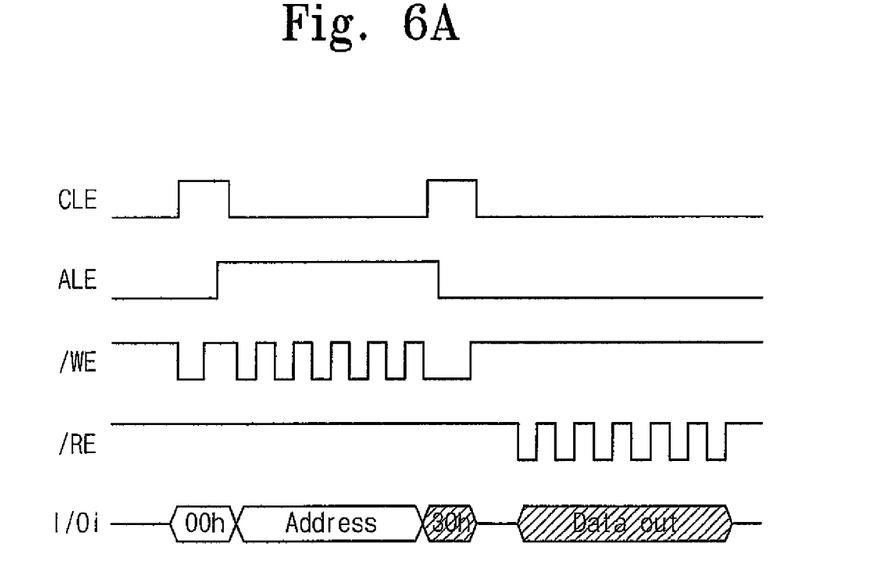
FIG. 6a is a timing diagram in response to a normal read command of a flash memory device of FIG. 5.
Figure 6B:
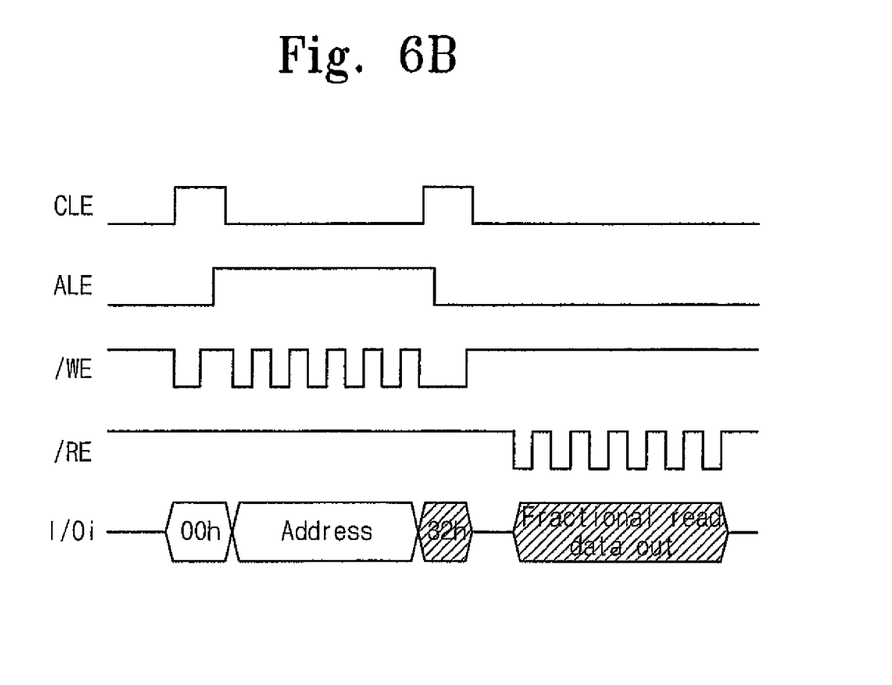
FIG. 6b is a timing diagram in response to an over-sampling read command of a flash memory device of FIG. 5.
Figure 6C:
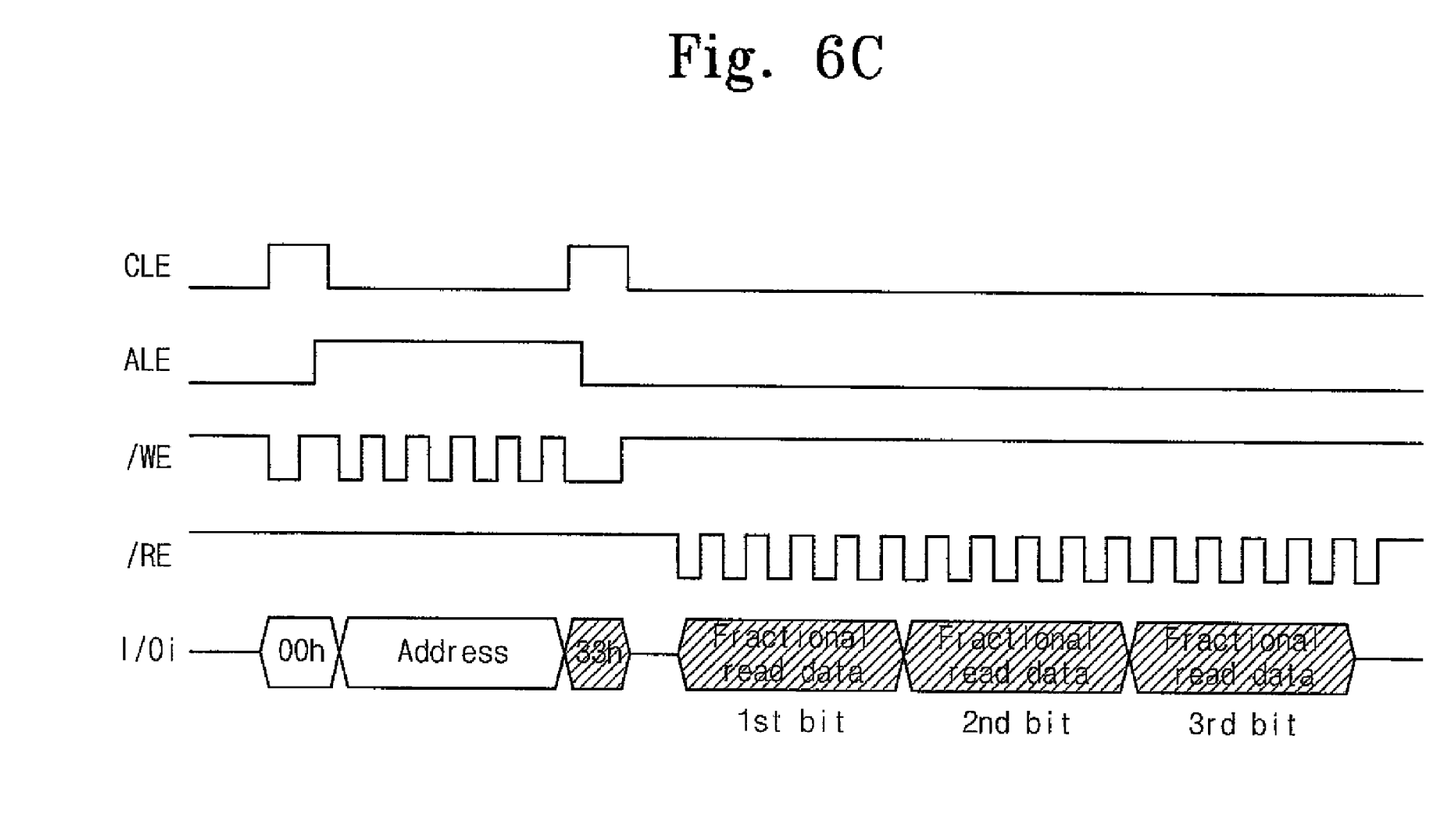
FIG. 6c is a timing diagram in response to an over-sampling read command in a cache reading method of a flash memory device of FIG. 5.

FIGS. 6a through 6c are timing diagrams of a data output operation according to a command code of the flash memory device. FIG. 6a is a timing diagram in response to a normal read command of the flash memory device 100 of FIG. 5. Command register and control logic 370 outputs multi-bit data by a page according to read voltages Vrd0 to Vrd6 in response to command code 30h. Data of one page are outputted in response to a one time command code 30h. FIG. 6b is a timing diagram in response to an over-sampling read command of a flash memory device of FIG. 5. Command register and control logic 370 performs an over-sampling read operation in response to command code 32h, and controls page buffer block 330 and high voltage generator 380 to output the sensed data. At this point, the outputted data are fractional read data that are sensed by the over-sampling read operation.

FIG. 6c is a timing diagram in response to an over-sampling read command in a cache reading method of a flash memory device of FIG. 5. When the command code is 33h, command register and control logic 370 sequentially performs an over-sampling read operation and stores a plurality of sensed page data on a cache. The stored page data are synchronized with an output enable signal /RE and sequentially outputted. In this manner, over-sampling can be achieved through command codes 32h and 33h.

Figure 7:
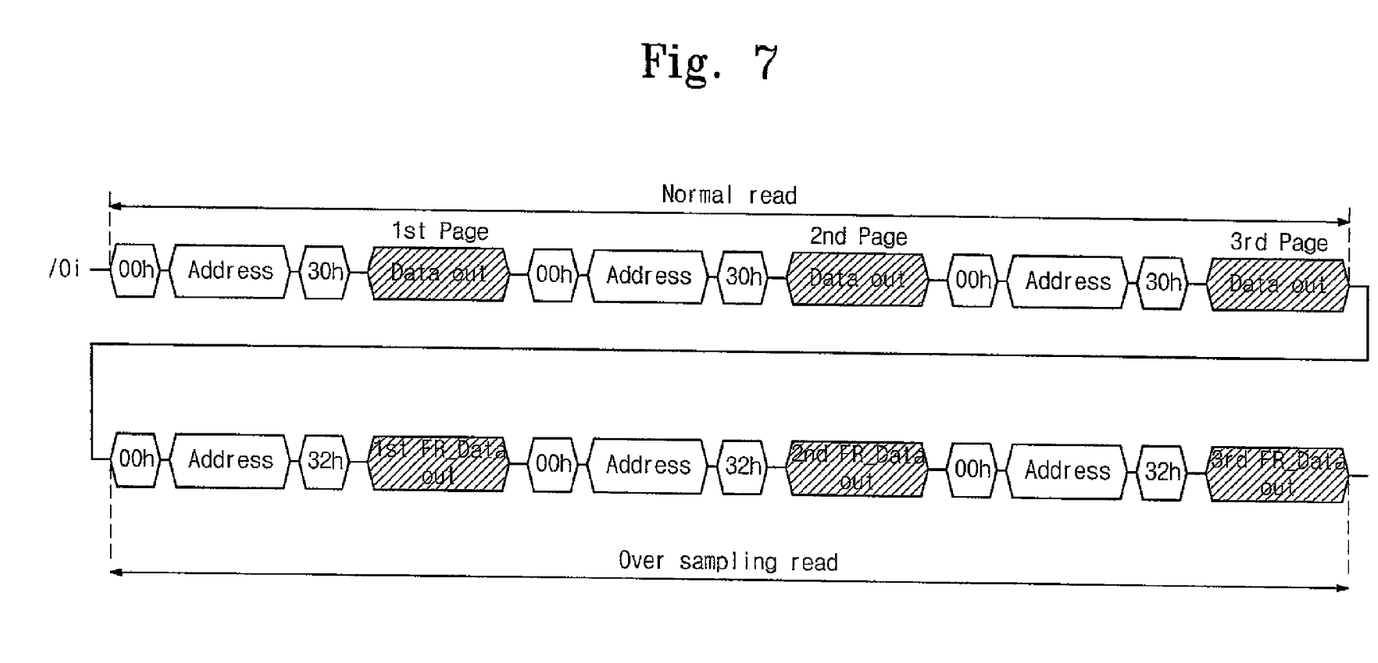
FIG. 7 is a timing diagram of a data reading method according to the present invention.

FIG. 7 is a timing diagram of a data reading method where a normal read operation is performed to read three pages (a first page to a third page). After the normal read operation, an over-sampling read operation corresponding to the three pages is performed. The controller provides a command to flash memory device 300 to select one of the read modes by a command code.

Figure 8:
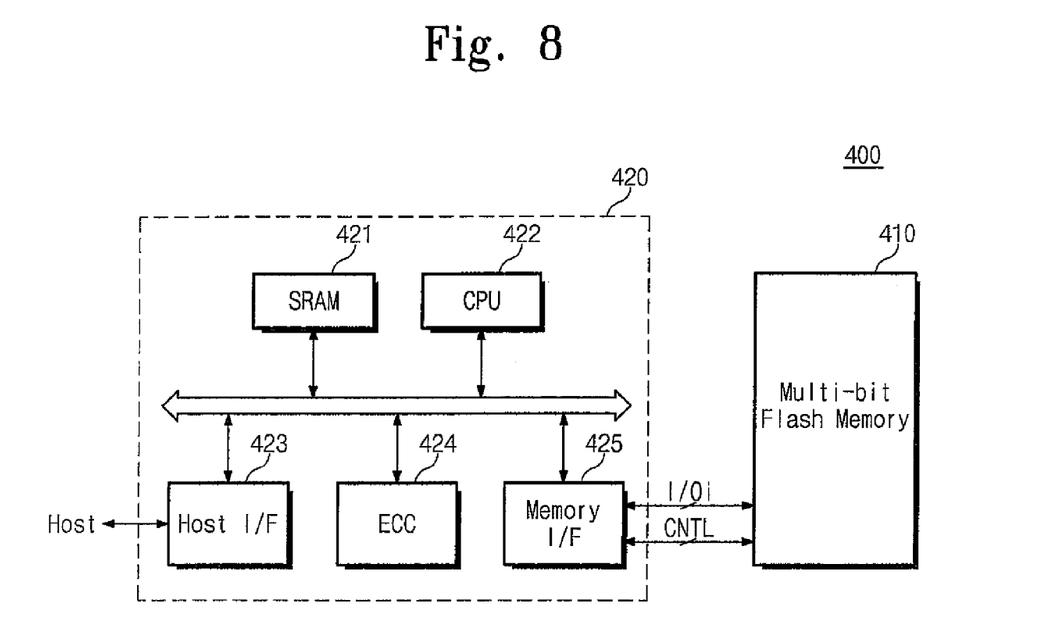
FIG. 8 is a block diagram of a memory card with a memory device.

FIG. 8 is a block diagram of memory card 400 including a multi-bit flash memory device 410. Memory card 400 includes memory controller 420 which controls general data exchanges between a host and the multi-bit flash memory device. Memory controller 420 can control the multi-bit flash memory device 410 by using command code 32h or 33h for an over-sampling read operation. Alternatively, memory controller utilizes one of the address bits for an over-sampling read operation as a signal indicating an over-sampling read mode, and thus controls multi-bit flash memory device 410.

SRAM 421 is used as an operating memory of processing unit 422. Interface 423 includes a data exchange protocol of a host connected to memory card 400. Error correcting block 424 detects and corrects an error in the data read from multi-bit flash memory device 410. Memory interface 425 interfaces with multi-bit flash memory device 410 and controls flash memory device 410 by command codes 32h and 33h to perform an over-sampling read operation in response to a host request. Memory interface 425 provides one of the address bits to the multi-bit flash memory device 410 to indicate an over-sampling read mode in response to a host request. Processing unit 422 refers to over-sampling data read after a normal read operation, and determines over-sampling data by utilizing a maximum likelihood operation. Additionally, processing unit 422 performs general operation for data exchange of memory controller 420. Although not illustrated in the drawings, it is apparent to those skilled in the art that memory card 400 may further include a ROM (not shown) to store code data for interfacing with the host.

A multi-bit flash memory device and a memory system is capable of performing an over-sampling read operation according to a command code or in response to one of a plurality of address bits. The flash memory device performs an over-sampling read operation and includes a controller that controls the flash memory device to provide a highly reliable memory device and an associated memory system.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A memory system comprising:
   a flash memory device having a memory array defined by a plurality of memory cells, said memory device configured to read data from one of said plurality of memory cells by performing an over-sampling read operation, said over sampling read operation utilizing an over sampling read voltage defined within a threshold voltage distribution range; and
   a memory controller communicating with said flash memory device and configured to supply a read mode signal to said flash memory device to perform the over-sampling read operation.

2. The memory system of claim 1, wherein the threshold voltage distribution comprises threshold voltage states corresponding to program data of the flash memory device.

3. The memory system of claim 1, wherein the over-sampling read voltage equally divides the threshold voltage distribution into at least two parts.

4. The memory system of claim 1, wherein the memory controller provides the over-sampling read mode signal to the flash memory device during an address input cycle.

5. The memory system of claim 4, wherein the over-sampling read mode signal is provided to the flash memory device during one of said cycles, said read mode signal corresponding to a logic value of one of a plurality of address bits associated with said memory array, said address bits inputted during a plurality of input cycles.

6. The memory system of claim 5, wherein the flash memory device further comprises:
   a page buffer communicating with said memory array and configured to detect data stored in the plurality of memory cells;
   a high voltage generator communicating with said controller and said memory array, said high voltage generator configured to provide a read voltage to a word line associated with a plurality of said memory cells; and
   a read mode detector communicating with said controller and configured to detect said over-sampling read mode signal from among the plurality of address bits, said controller configured to control said; and
   a flash memory controller controlling the high voltage generator and said page buffer to detect data stored in the selected memory cell based on the over-sampling read mode signal.

7. The memory system of claim 6, wherein the controller controls the high voltage generator to generate the over-sampling read voltage when the over-sampling read mode signal is activated.

8. The memory system of claim 1 wherein the memory controller provides the over-sampling read mode signal to the flash memory device during a command code input cycle, said flash memory device further comprising;
   a page buffer connected to said memory array and configured to detect data in the plurality of memory cells; and
   a high voltage generator connected to said memory cell array and configured to provide a read voltage to a word line of selected memory cells from among the plurality of memory cells;
   a flash memory controller connected to said page buffer and said high voltage generator, said flash memory controller configured to control said high voltage generator and said page buffer to detect data stored in the selected memory cells according to said over-sampling read mode signal inputted during the command code input cycle.

9. The memory system of claim 8, wherein the command code supports a cache read operation to sequentially output latched data according to said over-sampling read operation.

10. A memory system comprising:
    a controller generating a read mode signal that indicates one of a first mode and a second mode in response to an external operation request; and
    a flash memory device having a plurality of memory cells, said flash memory device communicating with said controller and configured to read data from selected memory cells from said plurality of memory cells based on said read mode signal received from said controller and supply said read data to said controller, wherein the second mode is an over-sampling read operation mode that reads data from the memory cells by using an over-sampling read voltage within a threshold voltage distribution range.

11. The memory system of claim 10, wherein the first mode is a normal read operation mode that reads data from the memory cells by using a read voltage set between threshold voltage distributions.

12. The memory system of claim 10, wherein the memory controller provides the read mode signal using one of a plurality of address bits supplied to the flash memory device.

13. The memory system of claim 12, wherein the flash memory device comprises:
    a read mode detector detecting a bit including the read mode signal from among the plurality of address bits;
    a high voltage generator communicating with said memory cell array and configured to provide a read voltage to a word line of said selected memory cells;
    a page buffer communicating with said memory cell array and configured to detect data in said selected memory cells; and
    a controller communicating with said high voltage generator and said page buffer, said controller configured to control said high voltage generator and said page buffer to perform a read operation corresponding to one of a first mode and a second mode according to the detected read mode signal.

14. A method of interfacing with a flash memory device perform an over-sampling read operation to read data from a memory cell based on an over-sampling read voltage falling within a threshold voltage distribution, said method comprising:
    providing an over-sampling read mode signal to the flash memory device to request the over-sampling read operation; and
    receiving data read form said flash memory device and outputted based on the over-sampling read operation.

15. The method of claim 14, wherein the over-sampling read mode signal is supplied to the flash memory device during an address input cycle.

16. The method of claim 15, wherein the over-sampling read mode signal is allocated to one of a surplus of bits from a plurality of address bits inputted during a column address input cycle not used as an address bit.

17. The method of claim 16 further comprising detecting the over-sampling read mode signal among the column address bits by the flash memory device during the column address input cycle.

18. The method of claim 14, wherein the over-sampling read mode signal is supplied to the flash memory device during a command code input cycle.

19. The method of claim 18, further comprising outputting page data according to an over-sampling read operation associated with the selected memory cells in response to a first command code, wherein the over-sampling read mode signal corresponds to a first command code.

20. The method of claim 18, further comprising sequentially outputting a plurality of page data according an over-sampling read operation associated with the selected memory cells in response to a second command code, wherein the over-sampling read mode signal corresponds to a second command code.

* * * * *